United States Patent
Stone et al.

(10) Patent No.: US 6,389,489 B1
(45) Date of Patent: May 14, 2002

(54) DATA PROCESSING SYSTEM HAVING A FIFO BUFFER WITH VARIABLE THRESHOLD VALUE BASED ON INPUT AND OUTPUT DATA RATES AND DATA BLOCK SIZE

(75) Inventors: Chris Randall Stone; Ritesh Radheshyam Agrawal, both of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/271,215

(22) Filed: Mar. 17, 1999

(51) Int. Cl.[7] ............ G06F 13/00; G06F 5/06; G11C 19/00
(52) U.S. Cl. .................... 710/57; 710/52; 711/109; 365/221
(58) Field of Search .................. 710/52, 57; 711/109, 711/154, 170, 171; 365/189.07, 221

(56) References Cited

U.S. PATENT DOCUMENTS

| | | | |
|---|---|---|---|
| 4,683,534 A | | 7/1987 | Tietjen et al. ............... 710/127 |
| 4,954,987 A | | 9/1990 | Auvinen et al. ......... 365/189.02 |
| 5,121,346 A | * | 6/1992 | McClure ........................ 702/79 |
| 5,155,810 A | | 10/1992 | McNamara, Jr. ............... 710/52 |
| 5,262,997 A | | 11/1993 | Lee ............................ 365/221 |
| 5,278,956 A | * | 1/1994 | Thomsen et al. ............. 711/167 |
| 5,287,481 A | | 2/1994 | Lin ............................. 711/135 |
| 5,295,246 A | | 3/1994 | Bischoff et al. ................ 710/34 |
| 5,327,545 A | | 7/1994 | Begun et al. ................. 711/133 |
| 5,602,850 A | | 2/1997 | Wilkinson et al. ............. 370/402 |
| 5,732,286 A | * | 3/1998 | Leger ............................. 710/57 |
| 5,771,356 A | * | 6/1998 | Leger et al. .................. 709/233 |
| 5,884,099 A | * | 3/1999 | Klingelhofer ................... 710/52 |
| 6,134,629 A | * | 10/2000 | L'Ecuyer ....................... 711/110 |

FOREIGN PATENT DOCUMENTS

EP 0 489 504 6/1992

OTHER PUBLICATIONS

Rosenberg, "Dictionary of Computers, Information Processing & Telecommunications", Second Edition, pp 9 and 470 (1984).

* cited by examiner

*Primary Examiner*—Glenn Gossage
(74) *Attorney, Agent, or Firm*—Daniel D. Hill; Lee E. Chastain

(57) ABSTRACT

A data processor (102) includes a first-in, first-out (FIFO) buffer (110) having a variable threshold. The FIFO buffer (110) has a plurality of entries (200) for storing at least a portion of a data block that is to be transmitted through the FIFO buffer (110). To allow data blocks of varying size to be transmitted at different data rates, a variable threshold value for determining a maximum fullness of the FIFO buffer (110) is automatically calculated by the data processor (102) for each data block. This allows the data block to be transmitted through the FIFO buffer (110) as a continuous data stream, without interruption, from the data processor (102) to a data consumer. The variable threshold value is appended to a first entry of the data block along with start bits to indicate a beginning of the data block. The FIFO buffer (110) may include read and write counters (208, 212) and a comparator (210) for comparing a difference between read and write pointers and the variable threshold value.

18 Claims, 2 Drawing Sheets

DATA PROCESSING SYSTEM HAVING A FIFO BUFFER WITH VARIABLE THRESHOLD VALUE BASED ON INPUT AND OUTPUT DATA RATES AND DATA BLOCK SIZE

FIELD OF THE INVENTION

This invention relates generally to data processing systems and more particularly to data buffering in a data processing system.

BACKGROUND OF THE INVENTION

Data or information in computers is processed in a predominantly serial fashion. Many times there are sources and destinations of data that are connected by buses. Usually there is a mismatch in the rate at which data is produced and the rate at which data can be accepted. One way to accommodate a mismatch in data rates is to use a first-in, first-out (FIFO) buffer between the data source and data destination.

Certain FIFOs contain threshold values that serve to control their operation. For instance, a threshold might be set to generate an interrupt to the data source if the source is about to exceed the capacity of the FIFO (overrun). Conversely, a threshold might be set to disable the output of data until an uninterrupted supply of data can be guaranteed (underrun). Some communications protocols specify fixed length transmissions of blocks, or packets, of data. If one or more gaps are interjected into the transmission because of, for example, an underrun or overrun, then one or more data beats at the end of the transmission may be ignored by the destination to ensure that an output data stream is transmitted without interruption and contains no bubbles or gaps.

DETAILED DESCRIPTION OF THE DRAWINGS

Figure 1:
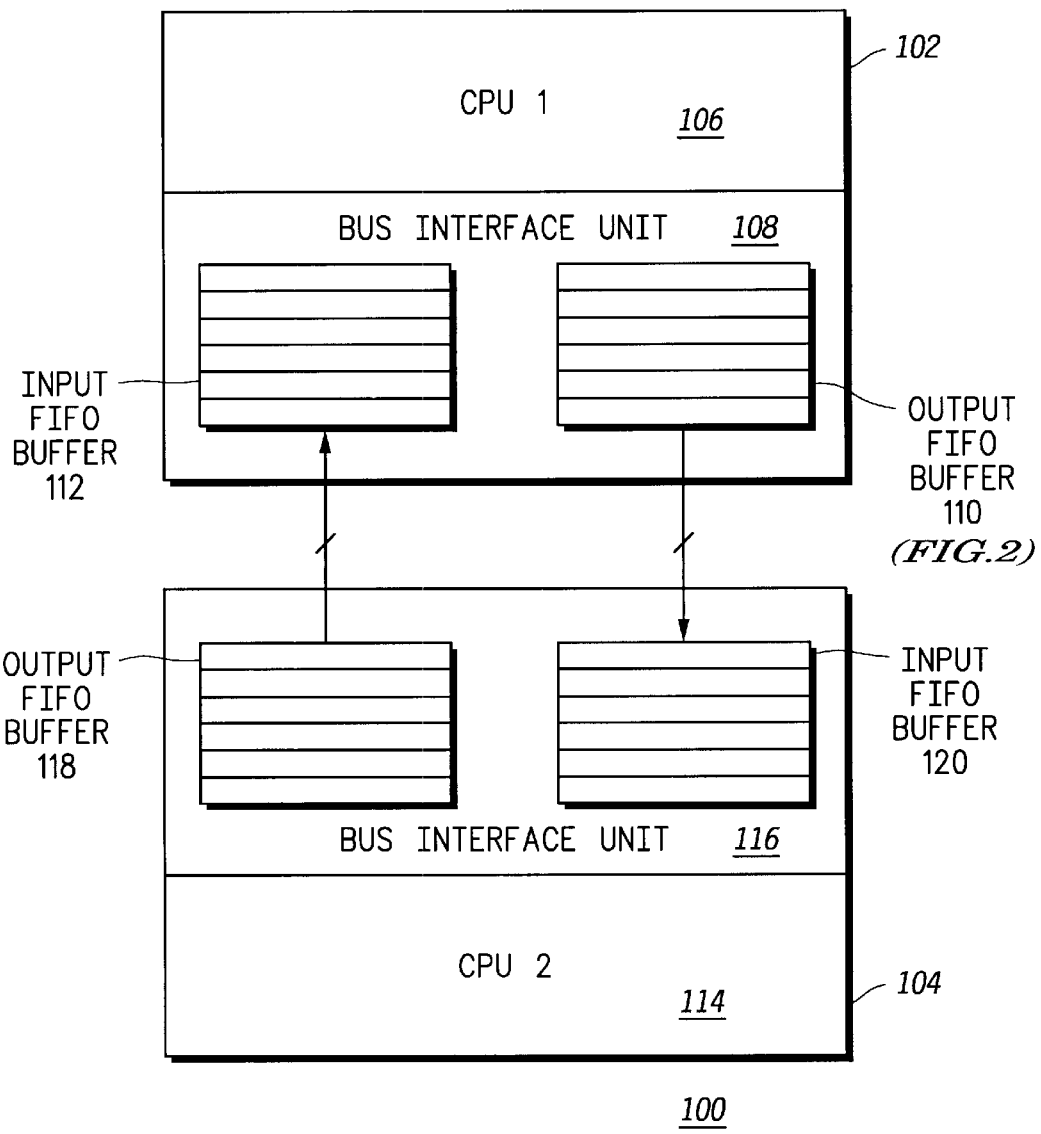
FIG. 1 illustrates, in block diagram form, a data processing system in which the disclosed invention may be incorporated.

FIG. 1 illustrates, in block diagram form, a data processing system 100 in which the disclosed invention may be incorporated. Devices in data processing system 100 communicate with each other using a high-speed bus protocol. Each device can operate at its own clock rate. According to this protocol, data to be transmitted between devices is grouped into packets by the device generating the data (data producer or source), buffered in FIFOs, and automatically transmitted to a receiving device (data consumer or destination). Control or "header" information is embedded into the packet and is used to indicate such things as the destination of the packet, its length, etc. Here, a first data processor 102 communicates with a second data processor 104 via two uni-directional communication buses. Data processor 104 may be able to consume data at a rate greater than the rate at which data processor 102 can produce data. However, data processor 104 cannot interrupt the transmission of a packet to wait for additional data. Therefore, data processor 102 uses a FIFO buffer to buffer a certain fraction of the packet before it begins transmitting the data to data processor 104. The minimum amount of data temporarily stored in the FIFO buffer depends upon the rate at which data processor 102 produces data, the rate at which data processor 104 consumes data, and the size of the packet. According to the illustrated embodiment, variable threshold information is stored in the FIFO along with data. The FIFO uses the threshold information as a predetermined maximum fullness value of the FIFO buffer. When the predetermined fullness, as determined by the threshold value, is reached, a data block, or packet, can be transmitted to the second device from the FIFO buffer without risk of introducing bubbles into an individual data packet. The data packet is transmitted as an uninterrupted data stream. The threshold value is automatically determined by the transmitting data processor on a per-packet basis to maximize data throughput. The transmitting data processor determines the variable threshold value as a function of a difference between an input data rate and an output data rate of the FIFO buffer, and a size of the data block to be transmitted through the FIFO buffer. The calculated threshold value is then appended to a first entry of the data block. Specifically, start-up latency is tailored to the size of each packet. For instance, shorter packets can be completely loaded into the FIFO faster than longer packets. In these cases, the shorter packets can have lower thresholds. This strategy may cause the FIFO to begin transmitting the shorter packet, as an unbroken data stream, earlier than if it had the threshold appropriate for the longer packet.

Continuing with FIG. 1, data processor 102 includes a central processing unit 106 (CPU 1) and a bus interface unit 108. Bus interface unit 108 includes an output FIFO buffer 110 and an input FIFO buffer 112. Similarly, data processor 104 includes a central processing unit 114 (CPU 2) and a bus interface unit 116. Bus interface unit 116 includes an output FIFO buffer 118 and an input FIFO buffer 120. The output FIFO buffer 110 is connected to the input FIFO buffer 120. Conversely, the output FIFO buffer 118 is connected to the input FIFO buffer 112. In the illustrated embodiment, data processor 102 is implemented on a separate integrated circuit than data processor 104.

In operation, CPU 1 executes instructions stored in memory (not depicted) using operands also stored in memory and received from an external source (not shown). Bus interface unit 110 coordinates communications from CPU 1 to other devices in the data processing system and vice versa. FIFOs 110 and 112 buffer data so that CPU 1 can perform other work while extended communications are in operation. FIFO 110 is described below in connection with FIG. 2. CPU 2 operates similarly.

The depicted embodiment illustrates a data processing system in which two data processors are connected directly to each other. Both the type and topology of devices in data processing system 100 can differ. For instance, data processor 104 may be replaced with a volatile memory system, with a non-volatile memory system, with one or more user input devices such as a keyboard or monitor, with a bus-to-bus interconnect, etc. Also, the single point-to-point topology depicted in FIG. 1 may be replaced with topologies that contain more than one possible data destination. For instance, data processor 102 may be installed in a ring topology in which messages are passed from device to device until a packet reaches its destination or returns to the data producer. Or, data processor 102 may be connected to a switched network topology in which a message is routed to a destination by an intermediate device connected to the data producer and to several data consumers.

Figure 2:
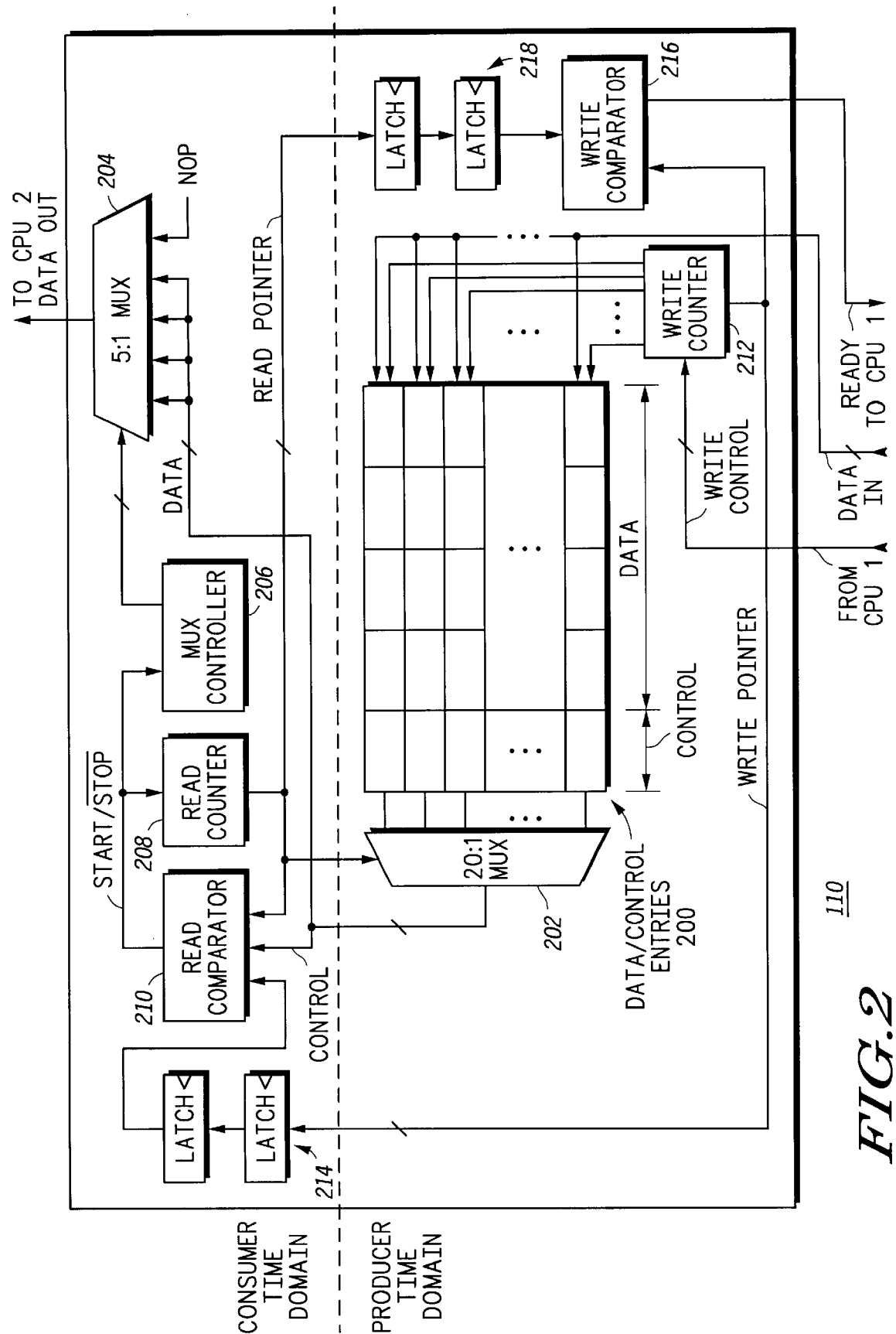
FIG. 2 illustrates, in block diagram form, a FIFO depicted in FIG. 1 constructed in accordance with the present invention.

FIG. 2 illustrates, in block diagram form, FIFO 110 depicted in FIG. 1 constructed in accordance with the present invention. FIFO 110 contains twenty DATA/ CONTROL ENTRIES 200. Each one of the entries contains eight CONTROL bits and sixty-eight DATA bits. The sixty-eight DATA bits are further divided into four seventeen bit sections. The input of each entry is connected to a data producer via DATA IN. Note that DATA IN includes both the data and control bits for each entry. The output of each entry is connected to a data consumer via a 20:1 multiplexer (MUX) 202 and a 5:1 MUX 204. A multi-bit control signal labeled READ POINTER selects which of the twenty inputs to MUX 202 is output to MUX 204. An output of MUX 202 provides a set of sixty-eight DATA bits from a selected entry to MUX 204. The first section of seventeen DATA bits output by MUX 202 are connected to the first input of MUX 204. The second section of seventeen DATA bits output by MUX 202 are connected to the second input of MUX 204. The third section of seventeen DATA bits output by MUX 202 are connected to the third input of MUX 204. The fourth section of seventeen DATA bits output by MUX 202 are connected to the fourth input of MUX 204. A default output labeled NOP is connected to the fifth input of MUX 204. The output of a MUX controller 206 selects which of the five inputs to MUX 204 is output to CPU 2 as DATA OUT. Note that the number of entries and the number of control bits and data bits per entry are provided for illustration purposes only and may be different in other embodiments.

MUX 202 also outputs a selected set of eight CONTROL bits to a read comparator 210. Read comparator 210 receives the control signal labeled READ POINTER and a multi-bit control signal labeled WRITE POINTER, each synchronized by a pair of serially connected latches, 214 and 218, respectively. Read comparator 210 generates a control signal STARTSTOP. The control signal STARTSTOP is connected to a read counter 208 and to MUX controller 206. Read counter 208 generates the control signal READ POINTER. A write counter 212 generates the control signal WRITE POINTER. Write counter 212 also encodes the control signal WRITE POINTER into a one-of-N format. A differing one of each of the N output signals is connected to a differing one of the DATA CONTROL ENTRIES 200. Write counter 212 receives a multi-bit control signal WRITE CONTROL from the data producer. In the illustrated embodiment, the data producer is CPU 1. A write comparator 216 receives the control signal READ POINTER synchronized by a pair of serially connected latches 218, receives the control signal WRITE POINTER, and generates a control signal labeled READY. The control signal READY is provided to the data producer.

Although the various blocks within FIFO 110 are integrated into a single electronic circuit, certain portions operate at different clock speeds. This differentiation enables the exchange of data between the data producer and FIFO 110 and enables the exchange of data between FIFO 110 and the data consumer. As described above, the data consumer operates at a higher clock rate than does the data producer. Specifically, MUX 204, MUX controller 206, read counter 208, read comparator 210, and latch pair 214 operate in the data consumer's time domain. Conversely, DATA/CONTROL ENTRIES 200, MUX 202, write counter 212, write comparator 216, and latch pair 218 operate in the data producer's time domain. Note that in other embodiments, the data rate of the data consumer may be lower than the data rate of the data producer, or may even have the same data rate as the producer.

The operation of FIFO 110 may be conveniently described with respect to its two major functions: writing data and reading data. After a reset or initialization operation, the write counter 212 and read counter 208 are set to the same initial value. Also, MUX controller 206 selects the fifth, or NOP, input of MUX 204 as its output.

Writing Data to FIFO 110

After reset, write comparator 216 will detect that the read and write pointers are equivalent. This equivalency indicates that no valid data is in FIFO 110, and that all entries are available for receiving data. At other times, the write pointer may lag the read pointer by more than one location. In these cases, there is at least one location in which to store data. In each of these circumstances, write comparator 216 will assert the control signal READY to the data producer indicating the ability of the FIFO to store data. At other times, FIFO 110 may become full. In this case, the write pointer will catch up to the read pointer. To avoid overwriting valid data, write comparator 216 will de-assert READY.

At some point, the data producer will be required to write data in FIFO 110. The data producer will input data to FIFO 110 via the data input DATA IN and will assert certain ones of control signals WRITE CONTROL, indicating valid data. Write counter 212 will enable one entry within FIFO 110 to store the data by asserting its single-bit output corresponding to the entry. Write counter 212 will also increment itself to ensure that previously stored data is not over-written at a later time.

Figure 3:
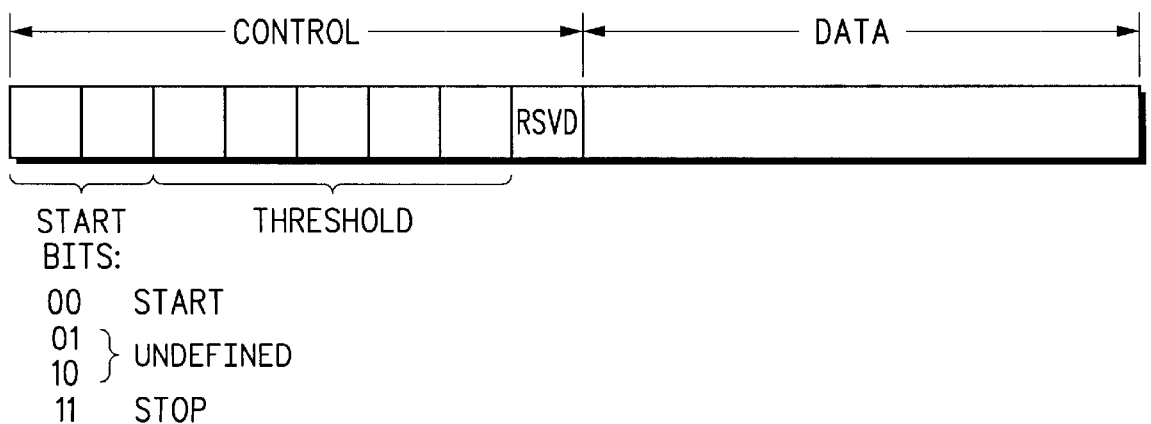
FIG. 3 illustrates, in graphical form, a DATA/CONTROL ENTRY depicted in FIG. 2.

As described above, the data producer will store 8 bits of control information and 68 bits of data in each entry. In the depicted embodiment, each packet begins at the first bit position in the first section of the entry. The end of the data packet can be located in any of the four sections of an entry. Furthermore, each packet may occupy more than or less than a single entry, or a packet may be larger than the FIFO can store at once. Five of the eight control bits reflect a threshold value. FIFO 110 will not begin transmission of a packet until at least R entries are filled. The threshold value, R, is automatically calculated by the data producer for each packet using the equation:

$$R = INT\left\{T*\left(\frac{f_c - f_p}{f_c}\right) + 1.5\right\} \qquad \text{Equation 1}$$

where T is the number of FIFO entries required to store the entire packet, $f_c$ is the clock frequency of the data consumer, and $f_p$ is the clock frequency of the data producer. The function INT conventionally rounds its input to an integer. The data producer calculates R for each packet it buffers in FIFO 110 and includes the threshold value in the packet data stream to be stored in the threshold value bit field of the control bit section of an entry along with start bits to indicate a beginning of a data packet. Those skilled in the art will recognize that Equation 1 is not the only way to calculate the threshold value and other equations may be used in other embodiments depending upon factors such as available hardware and the particular application. FIG. 3 illustrates the bit fields of an entry, and will be discussed later. Note that the CPU of the data producer may be used to determine the threshold value using Equation 1, or a dedicated co-processor may be used in order to reduce the work load of the CPU.

Reading Data from FIFO 110

MUX controller 206 and read comparator 210 attempt to output data to the data consumer as soon as possible. However, there are two conditions in which FIFO 110 cannot output data. When FIFO 110 cannot output data, MUX controller 206 selects the default output NOP as the output of MUX 204. The first condition in which MUX 204 outputs NOP is when there is no buffered data to output. In this first case, read comparator 210 detects that the read and write pointers are equivalent, and de-asserts the control signal STARTSTOP. The second condition in which MUX 204 outputs NOP is when there is buffered data but less than the amount specified in the threshold control field. In this second case, read comparator 210 receives the calculated threshold field output by MUX 202 and compares it with the difference between the read and write pointers. If the difference is less than the threshold value, then read comparator 210 will de-assert the control signal STARTSTOP to stop the data flow to the consumer.

As the data producer buffers data in FIFO 110, write counter 212 increments its output WRITE POINTER. Eventually, the data producer will buffer enough information to begin outputting data to the data consumer. Read comparator 210 will detect this condition when the difference between the read and write pointers is equal to or greater than the stored threshold value. Read comparator 210 asserts the control signal STARTSTOP. MUX controller 206 then selects the first input to MUX 204 as its output. MUX controller 206 will cycle through its first through fourth inputs synchronously with the data consumer time domain clock. Read counter 208 increments its output READ POINTER after four consumer domain clock cycles. Note, the READ POINTER indicates which DATA/CONTROL ENTRY is output by MUX 202. MUX controller 206 and read comparator 210 will continue outputting each successive entry until the packet is completely output to the data consumer. Read comparator 210 detects the end of each packet by a particular CONTROL bit field. Read comparator 210 will perform a new comparison between the read pointer, write pointer, and threshold field for the next packet. If the data packet is larger than the FIFO buffer can store at one time, write operations to the FIFO buffer will overlap in time with the read operations to ensure that a continuous data stream is transmitted to the data consumer.

By allowing the data producer to calculate a threshold value for each data block, each of the different sized data blocks can transmitted through the first-in, first-out buffer without interruption from the producer of the data to the consumer of the data.

FIG. 3 illustrates, in graphical form, a DATA/CONTROL ENTRY depicted in FIG. 2. The first and second bits comprise a START field to indicate when to start transferring data to the FIFO buffer. All entries associated with a single packet except the last entry are encoded with the pattern 00. The last entry in a packet is encoded with the pattern 11 to indicate stop transferring data. This bit pattern indicates to read comparator 210 to perform another comparison. The third through seventh bits comprise the THRESHOLD field. At least the first entry in each packet contains a value corresponding to the number of entries required before beginning data transmission. The control bits used to indicate START also indicate that a corresponding variable threshold value is valid. The subsequent entries may or may not contain the threshold value.

Although the present invention has been described with reference to a specific embodiment, further modifications and improvements will occur to those skilled in the art. For example, in the described embodiment, all non-final entries in a packet are coded with a START field 00. In other embodiments, all entries between the first and last entry could be encoded with a bit pattern other than 00 or 11. Furthermore, the THRESHOLD field could be modified to identify the location of the end of a packet within the last entry. FIFO 110 could then begin the next packet transmission without outputting meaningless data. Also, the above description contains only generic references to data. In one embodiment, each entry in FIFO 110 may contain one or more instructions for execution by a data processor or by execution units in a data processor. For example, the disclosed invention could be used to initiate sequential execution of instructions in an instruction stack of a data processing system without the problem of gaps between the instructions. Therefore, it is intended that this invention encompass all such variations and modifications as fall within the scope of the appended claims.

What is claimed is:

1. A first-in, first-out buffer for transmitting a data block from a data producer to a data consumer, the first-in, first-out buffer comprising:
   a plurality of entries, each of the plurality of entries for temporarily storing at least a portion of the data block and a variable threshold value;
   a write counter for providing a write pointer value for determining a current entry of the plurality of entries in which to write data and the variable threshold value;
   a read counter for providing a read pointer value for determining a current entry of the plurality of entries from which to read data and the variable threshold value; and
   a read comparator for determining that a difference between the read pointer value and the write pointer value is greater than or equal to the variable threshold value, and in response, causing the at least a portion of the data block to be read from the plurality of entries, wherein the variable threshold value is determined based on an input data rate and an output data rate of the first-in, first-out buffer, and a size of the data block to be transmitted through the first-in, first-out buffer.

2. The first-in, first-out buffer of claim 1, wherein data blocks transmitted through the first-in, first-out buffer differ in size and each data block is transmitted without interruption from the data producer to the data consumer.

3. The first-in, first-out buffer of claim 1 wherein the variable threshold value determines a maximum fullness of the plurality of entries for a predetermined data block.

4. The first-in, first-out buffer of claim 1 wherein a variable threshold value corresponding to the data block is appended to a first entry of the data block to be transmitted through the first-in, first-out buffer.

5. The first-in, first-out buffer of claim 1, wherein the variable threshold value is automatically recalculated by a data processor for each data block to be transmitted.

6. The first-in, first-out buffer of claim 1, wherein a write operation to the first-in, first-out buffer overlaps with a read operation from the first-in, first-out buffer.

7. The first-in, first-out buffer of claim 1, further comprising a write comparator for determining a difference between the read pointer value and the write pointer value and in response, indicating an available entry of the plurality of entries.

8. The first-in, first-out buffer of claim 1, wherein first control bits are appended to a first entry of the data block to indicate when to start transferring the data block and second control bits are appended to a last entry of the data block to indicate when to stop transferring the data block.

9. The first-in, first-out buffer of claim 8, wherein the data block is transmitted through the first-in, first-out buffer without interruption in response to the read counter receiving the first control bits.

10. The first-in, first-out buffer of claim 8, wherein the first control bits indicate that a corresponding variable threshold value is valid.

11. A data processing system, comprising:

a processing unit for executing instructions; and a first-in, first-out buffer comprising:

- a plurality of entries, each of the plurality of entries for temporarily storing at least a portion of a data block and a variable threshold value;
- a write counter for providing a write pointer value for determining a current entry of the plurality of entries in which to write data and the variable threshold value;
- a read counter for providing a read pointer value for determining a current entry of the plurality of entries from which to read data and the variable threshold value; and
- a read comparator for determining that a difference between the read pointer value and the write pointer value is greater than or equal to the variable threshold value, and in response, causing the at least a portion of the data block to be read from the plurality of entries, wherein the variable threshold value is based on a difference between an input data rate and an output data rate of the first-in, first-out buffer, and a size of the data block to be transmitted through the first-in, first-out buffer.

12. The data processing system of claim 11, wherein a write operation to the first-in, first-out buffer overlaps with a read operation from the first-in, first-out buffer.

13. The data processing system of claim 11, further comprising a write comparator for determining a difference between the read pointer value and the write pointer value and in response, indicating an available entry of the plurality of entries.

14. The data processing system of claim 11, wherein first control bits are appended to a first entry of the data block to indicate when to start transferring the data block and second control bits are appended to a last entry of the data block to indicate when to stop transferring the data block.

15. The data processing system of claim 14, wherein the first control bits indicate that a corresponding variable threshold value is valid.

16. A data processing system, comprising:

a central processing unit for executing instructions; and a first-in, first-out buffer for transmitting data blocks of variable size and at variable data rates from the data processing system to a data consumer that is external to the data processing system, wherein a fullness of the first-in, first-out buffer is controlled by a variable threshold value, and the variable threshold value is automatically determined to allow a data block to be transmitted through the first-in, first-out buffer as a continuous data stream without interruption, the first-in, first-out buffer comprising:

- a plurality of entries, each of the plurality of entries for temporarily storing at least a portion of the data block and a corresponding variable threshold value;
- a write counter for providing a write pointer value for determining a current entry of the plurality of entries in which to write data and the variable threshold value;
- a read counter for providing a read pointer value for determining a current entry of the plurality of entries from which to read data and the variable threshold value, wherein read operations from, and write operations to, the first-in, first-out buffer overlap;
- a write comparator for determining a difference between the read pointer value and the write pointer value and in response, indicating an available entry of the plurality of entries; and
- a read comparator for determining that a difference between the read pointer value and the write pointer value is greater than or equal to the variable threshold value, and in response, causing the at least a portion of the data block to be read from the plurality of entries, wherein the variable threshold value is determined using a difference between an input data rate and an output data rate of the first-in, first-out buffer, and a size of the data block to be transmitted through the first-in, first-out buffer.

17. The data processing system of claim 16, wherein first control bits are appended to a first entry of the data block to indicate a beginning of the data block and second control bits are appended to a last entry of the data block to indicate an end of the data block.

18. The data processing system of claim 17, wherein the first control bits indicate that a corresponding variable threshold value is valid.

\* \* \* \* \*